United States Patent [19]

Pond

[11] 4,271,448
[45] Jun. 2, 1981

[54] ELECTRONIC PROTECTION CIRCUIT FOR SOLID STATE SWITCHES ENERGIZING AC LOADS

[75] Inventor: Robert J. Pond, Doylestown, Ohio

[73] Assignee: Acme Cleveland Corporation, Highland Heights, Ohio

[21] Appl. No.: 93,218

[22] Filed: Nov. 13, 1979

[51] Int. Cl.³ .............................................. H02H 9/02
[52] U.S. Cl. ..................................... 361/93; 323/246
[58] Field of Search .................. 361/93, 98, 100, 101, 361/111; 323/9

[56] References Cited

U.S. PATENT DOCUMENTS

| 3,624,490 | 2/1964 | Fisher | 323/9 |
|---|---|---|---|
| 3,638,102 | 1/1972 | Pelka | 323/9 |
| 3,723,854 | 3/1973 | Kita | 323/9 |
| 3,748,569 | 7/1973 | Frank et al. | 323/9 |

Primary Examiner—J. D. Miller
Assistant Examiner—Reinhard J. Eisenzopf
Attorney, Agent, or Firm—Pearne, Gordon, Sessions, McCoy & Granger

[57] ABSTRACT

A two-terminal overcurrent sensing transistor circuit of the fold-back type is inserted in electrical series relationship with an AC load and an associated load-energizing, solid state, semiconductor switch. Under normal operating conditions, the transistor circuit presents a very low impedance to permit load energization when the solid state switch is conducting, and hence has a very low impedance. Upon sensing an overcurrent condition, caused for example by a short circuit across the load, the transistor circuit rapidly switches to and locks into a high impedance circuit protection state to limit current through the series-associated solid state switch. A charged capacitor holds the transistor circuit into its high impedance state subsequent to clearing of the short circuit fault until reset by interrupting the application of power to it. The disclosed protection scheme finds particularly advantageous use in the short circuit protection of AC line-operated proximity switches. The foregoing abstract is merely a resume of one general application, is not a complete discussion of all principles of operation or applications, and is not to be construed as a limitation on the scope of the claimed subject matter.

9 Claims, 5 Drawing Figures

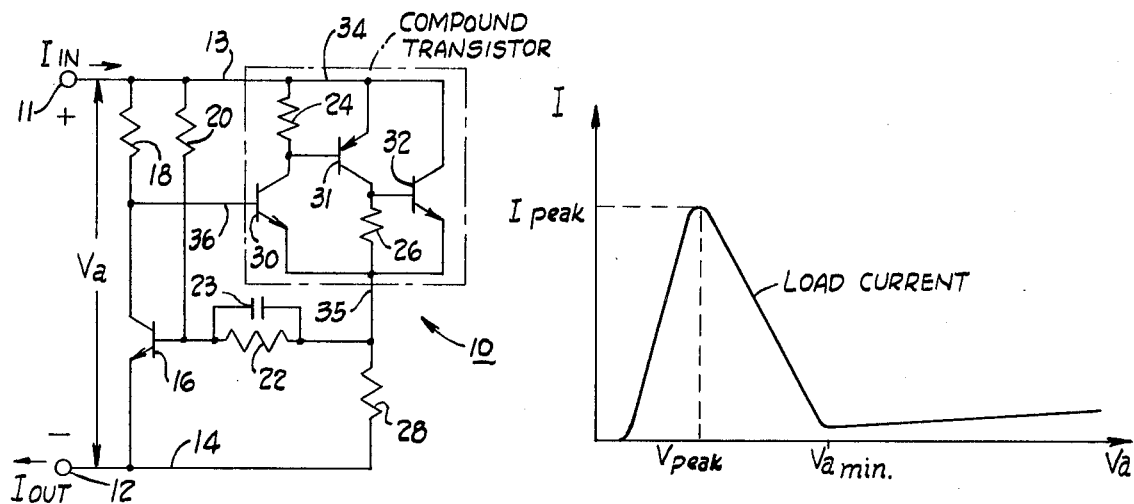
Fig. 1
Fig. 2
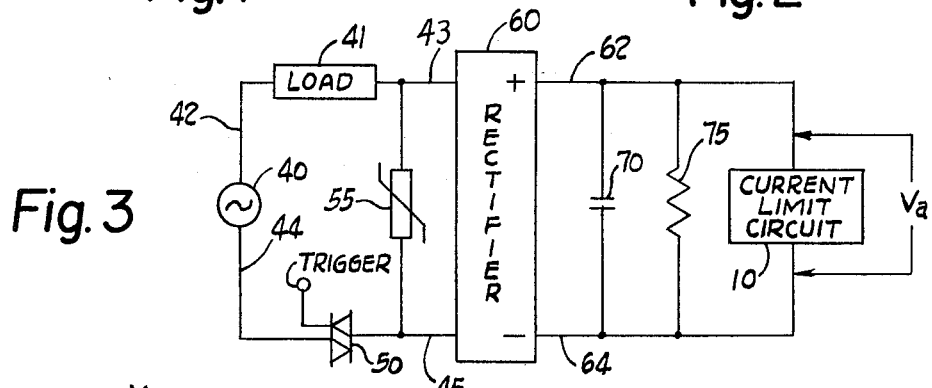
Fig. 3
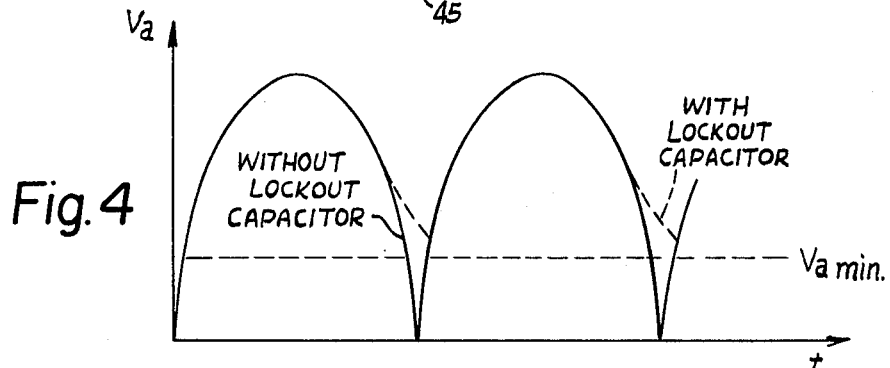
Fig. 4
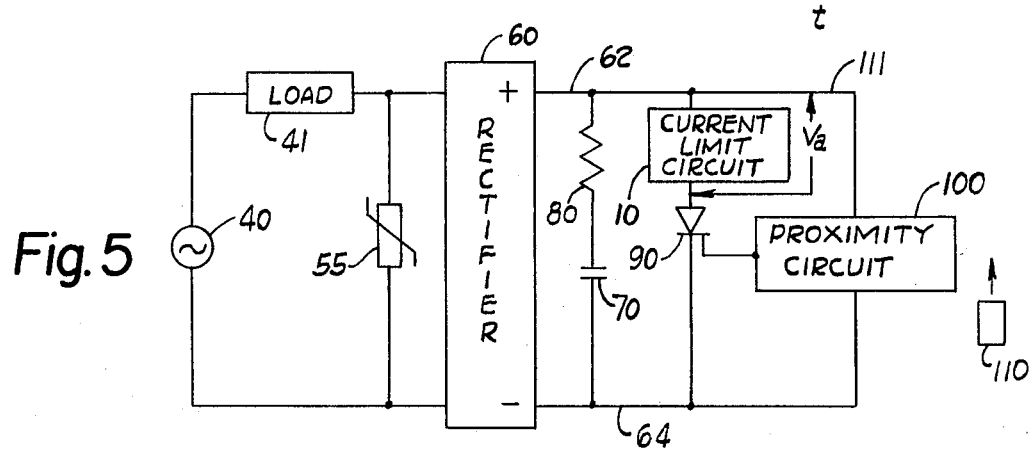
Fig. 5

ELECTRONIC PROTECTION CIRCUIT FOR SOLID STATE SWITCHES ENERGIZING AC LOADS

BACKGROUND OF THE INVENTION

The present invention relates in general to fold-back type current limiting circuits, and in particular to overcurrent protection circuits for AC load-energizing semiconductor switches such as target-actuated, line-operated, solid state proximity switches.

It is generally accepted that in many applications solid state devices are superior replacements for relays, mechanical switches, and other electromechanical devices because of their inherently high reliability and speed due to the lack of moving parts. It is also well known that such solid state devices are more prone to failure under overvoltage and/or overcurrent conditions than their electromechanical counterparts.

A particularly troublesome area of solid state device failure is in AC line-operated (110–220 VAC) semiconductor switch applications, such as the application of series-inserted, solid state proximity switches for energizing AC loads actuated by a target tripping the proximity switches, the target being, for example, an assembly line product moving past work stations of a manufacturing plant.

Wiring for such line-operated semiconductor switches may cover large distances in the manufacturing plant. Mechanical abuse or incorrect connection of the switch wiring may cause a short circuit condition which, if left uncompensated, will destroy the semiconductor switch when actuated by the target into a conducting condition.

Fold-back type overcurrent protection circuits for insulating devices from the effects of short circuit conditions are known. U.S. Pat. No. 3,638,102 illustrates such an overload protection circuit, usually connected in series with the device to be protected, wherein current through the protection circuit is limited to a preset maximum value under overload conditions, the protection circuit being at a high impedance state. Upon clearing of the overload fault, the illustrated fold-back protection circuit automatically returns to a normal low impedance operating state to permit normal current flow. In many line-operated, proximity switch applications, it is not desirable for safety reasons to restore full power to the load upon clearing of a short circuit fault.

It is an object of the present invention to provide a resettable, lockout type short circuit protector having particular application to the protection of line-operated, solid-state proximity switches wherein short circuit fault clearing would not result in immediate re-energization of the load.

SUMMARY OF THE INVENTION

The present invention is applied in the short circuit protection of a load-energizing semiconductor switch in electrical series relationship with an AC load and an AC source.

An overcurrent sensing circuit, responsive to unidirectional flow through it, is inserted in electrical series relationship with the source, the load and the semiconductor switch. The sensing circuit switches from a low impedance state to a high impedance state when the unidirectional current through it exceeds a predetermined current amplitude. The sensing circuit maintains the high impedance state to limit current through the semiconductor switch until the voltage across the sensing circuit decreases to a predetermined voltage amplitude.

A full-wave rectifier between the AC source and the sensing circuit converts AC current through the load to a generally equivalent amount of unidirectional load current sensed by and routed through the sensing circuit.

A capacitor maintains the voltage across the sensing circuit above the predetermined voltage amplitude to hold the sensing circuit at the high impedance state subsequent to sensing of an overcurrent condition.

The present invention provides a fast-acting, highly reliable solid-state short circuit protector which locks out upon being tripped to a high impedance condition. Clearing of the short circuit-causing fault does not reset the protector. Rather, removal of power from the protector to drop the voltage across it below the predetermined voltage value causes the protector to reset to its normal low impedance condition.

Other objects and a fuller understanding of the invention may be had by referring to the following description and claims, taken in conjunction with the accompanying drawing.

BRIEF DESCRIPTION OF THE DRAWING

FIG. 1 is a schematic diagram of a fold-back type overcurrent-sensitive, current limit circuit suitable for use in practicing the present invention;

FIG. 2 is a graph representative of a voltage/current response characteristic of the circuit illustrated in FIG. 1;

FIG. 3 is a schematic diagram of a load control circuit incorporating the present invention;

FIG. 4 is a waveform diagram of a voltage parameter of the circuits illustrated in FIGS. 3 and 5 when the current limit circuit of FIG. 1 is in a high impedance state; and FIG. 5 is a schematic diagram of another load control circuit incorporating the present invention.

DETAILED DESCRIPTION OF THE PREFERRED EMBODIMENTS

Turning to FIG. 1, there is illustrated a two-terminal overcurrent sensing transistor circuit or current limit circuit 10, suitable for use in practicing the present invention. The circuit 10 is of the "fold-back" type and is responsive to unidirectional current. The circuit 10 includes first and second terminals, including an input current terminal 11 and an output current terminal 12, the voltage across these terminals being identified as $V_a$. The input current terminal 11 electrically extends to provide a positive voltage buss 13, while the output current terminal 12 electrically extends to provide an associated negative voltage or neutral buss 14, as the case may be, depending upon the in-circuit connection of the circuit 10.

A current diverter NPN-type transistor 16 is provided having its emitter directly connected to the negative voltage or neutral buss 14, as illustrated. The collector of the current diverter transistor 16 is electrically connected to one end of a bias current-providing resistor 18 having its other end connected to the positive voltage buss 13. The resistor 18 and transistor 16 are in electrical series relationship with each other, and comprise a network paralleling the terminals 11, 12.

A first voltage dividing resistor 20 having one end connected to the positive voltage buss 13 is connected at its other end to the base of the current diverter transistor 16. The base of the transistor 16 is also connected to an end of a second voltage divider resistor 22 having its other end connected to the high side of a proportioning resistor 28, in turn having its low side connected to the buss 14. It can be seen that a voltage $V_a$ across the terminals 11, 12, will cause current flow through series-connected resistors 20, 22, 28. A turn-on retarding capacitor 23 is connected across the second voltage divider resistor 22, as illustrated.

A first NPN-type transistor 30, a second PNP-type transistor 31, and a third NPN-type transistor 32 are interconnected to provide a very high gain compound transistor having a current input 34, a current output 35, and a control input 36. The emitters of transistors 30, 32 are tied together to the current output 35, while the collector of transistor 31 and the base of transistor 32 are tied together and in turn connected to the current output 35 via a first temperature compensation resistor 26. The emitter of transistor 31 and the collector of transistor 32 are tied together to the current input 34 of the compound transistor, while the base of transistor 31 and the collector of transistor 30 are tied together and connected to the current input 34 via a second temperature compensation resistor 24. The current input 34 of the compound transistor is electrically connected to the positive voltage buss 13 while the current output 35 of the compound transistor is connected to the high side of the proportioning resistor 28. The compound transistor control input 36 constituted by the base lead of transistor 30 is connected to the junction of the collector of current diverter transistor 16 and the bias current providing resistor 18.

As a current limit fold-back type overload protection circuit, the maximum unidirectional current allowed to pass from terminal 11 to terminal 12 is limited to a preset value, i.e., a predetermined current amplitude ($I_{peak}$). Upon sensing excess current, the circuit 10 rapidly switches from a normally low impedance state to a circuit protection high impedance state. The current limit transistor circuit 10 will maintain the high impedance state to limit current flowing through it, and through other components electrically connected in series relationship with it, until the voltage $V_a$ across terminals 11 and 12 decreases to a predetermined voltage amplitude.

In normal operation without overcurrent, the circuit 10, utilizing the very high gain ($H_{FE}$) compound transistor, constituted by interconnected transistors 30, 31, 32 and resistors 24 and 26, receives bias current at its control input 36 from resistor 18 (transistor 16 non-conducting). The current flow through the compound transistor from input 34 to output 35 is substantially unimpeded since the compound transistor is driven fully on to provide a low impedance path from terminal 11 to terminal 12, resistor 28 being of very low ohmic value, in the order of 0.05 ohms. Under these conditions, the current diverting transistor 16 is maintained in an off condition. Temperature-compensating resistors 24 and 26 prevent junction leakage currents from turning on the compound transistor at high temperatures, and also help to remove stored base charge during turn-off of the compound transistor. Under normal operating load impedance conditions, the voltage divider action of the resistors 20 and 22 maintains transistor 16 is a non-conducting condition.

Upon an increase in current flow through circuit 10 via the compound transistor, caused for example by a short circuited condition across an associated series-connected load, the proportioning resistor 28 develops a voltage proportional to such increasing current. When the product of the increasing compound transistor current and the resistance of resistor 28 exceeds the base emitter turn-on voltage of the current diverter transistor 16, the transistor 16 switches on and bias current is proportionally diverted away from the control input 36 of the compound transistor through the conducting transistor 16 to prevent further increases in current flow through the compound transistor.

If the voltage $V_a$ continues to increase, additional current feedback through the first voltage divider resistor 20 is applied to the base of current diverter transistor 16 to drive it into a fully conducting condition and turn off transistors 30, 31, and 32 comprising the compound transistor constituting the low impedance path through the overcurrent protection circuit 10. Under these conditions, the circuit 10 presents a high series impedance in the order of 16 kilohms (typical value of bias resistor 18 in parallel with divider resistor 20) to effectively limit unidirectional current flow from input terminal 11 to output terminal 12. The circuit 10 will remain in the high impedance state until the voltage $V_a$ drops to a predetermined voltage amplitude (turn-off of transistor 16), wherein the current limit circuit 10 will switch back automatically to its low impedance state to restore normal circuit operation. A turn-on retarding capacitor 23 ensures the transistor 16 will turn on softly to preclude switching the current limiting circuit 10 to a high impedance condition during high voltage transients that may be experienced upon initial application of the input power to the circuit 10. It also speeds up the turn-off of transistor 16 when a rapid, fast rise-time current increase occurs.

The characteristics of the fold-back type circuit 10 illustrated in FIG. 1 are graphically represented in FIG. 2, wherein it can be seen that an increased current accompanied by a proportional nearly linear increase in voltage across the current limit circuit 10 reaches a predetermined current amplitude ($I_{peak}$), whereupon the current limit circuit 10 in effect quenches the current by switching to a high impedance state wherein the voltage drop ($V_a$) across the current limit circuit increases. At a predetermined voltage amplitude $V_{a\ min}$, the current limit circuit 10 is at a full high impedance state wherein current is limited to its smallest amount. Further increases in voltage across the current limit circuit 10 result in only small increases in current.

The predetermined voltage amplitude $V_{a\ min}$ must be exceeded to hold the current limit circuit 10 in its high impedance state. If the voltage $V_a$ drops below the predetermined voltage amplitude $V_{a\ min}$, the current limit circuit 10 switches back to a normal low impedance state wherein the compound transistor is turned fully on and current diverter transistor 16 is in a non-conducting condition.

In accordance with the present invention, FIG. 3 illustrates a short circuit-protected load circuit having in electrical series relationship an AC source 40, typically constituted by 110–220 VAC commercial power lines, an AC load 41, and a solid-state, load-energizing semiconductor switch 50. The current limit circuit 10 is inserted in electrical series relationship with the source 40, the load 41, and the semiconductor switch 50. A conventional full wave rectifier means 60 having an AC input side constituted by a high side bridge input 43 and a low side bridge input 45 and a DC output side constituted by a DC output 62 and a DC return 64, is connected between the source 40 and the current limit circuit 10. The rectifier 60 converts AC current through the load 41 to a generally equivalent amount of unidirectional load current sensed by and routed through the current limit circuit 10. Under normal operating conditions, positive polarity current generated by the source 40 flows to a high side supply line 42 through the load 41 to rectifier 60, through DC output 62, through the current limit circuit 10 (in its low impedance condition), through DC return 64, back through the rectifier 60, through low side bridge input line 45, through the load-energizing control switch 50 (triggered into its conducting condition), and back to the supply 40 via a low side line 44. Under negative polarity current conditions, it can be seen that current flow through the source 40, the load 41, and the switch 50 is reversed, while the rectifier bridge 60 maintains the unidirectional current flow through the current limit circuit 10.

With the current limit circuit 10 in its low impedance condition, the voltage across the DC output side of the bridge, i.e., the voltage across the DC output 62 and the DC return 64, is pulsating DC, with a maximum amplitude less than $V_{peak}$. When the current limit circuit is in the high impedance condition, FIG. 4 illustrates the pulsating DC voltage, $V_a$, with and without a lock-out capacitor 70 of, for example, 0.1 microfarads. The capacitor 70 charges to a level in excess of the predetermined voltage amplitude $V_{a\ min}$ wherein the current limit circuit 10 is locked in its high impedance condition as long as $V_a$ is greater than $V_{a\ min}$. It can be seen that the unidirectional load current sensed by and flowing through the current limit circuit 10 is substantially 100 percent amplitude-modulated by the rectified source voltage at twice the AC source frequency when the current limit circuit is in a low impedance state. When the current limit circuit switches to its high impedance state (as discussed earlier with regard to FIG. 1), the high impedance of the circuit 10 in combination with the parallel resistor 75 and the parallel capacitor 70 constitutes an RC circuit having a time constant large enough to maintain the voltage across the current limit circuit at a level larger than the predetermined voltage amplitude $V_{a\ min}$ wherein the resultant unidirectional load current to the circuit 10 is amplitude-modulated by the rectified source voltage to a degree less than 100 percent as illustrated by the dash lines in FIG. 4.

A current bleed resistor 75 parallels the lockout capacitor 70 and functions to partially discharge or load the capacitor 70 when the current limit circuit 10 is in a high impedance state. It is desirable to maintain some ripple in the DC current across the DC output side of the bridge 60. If the capacitor were allowed to completely filter out such ripple, the steady DC voltage across the current limit circuit would be approximately equal to the AC peak voltage amplitude on the AC input side of the bridge, resulting in unnecessary and undesirable power dissipation in the current limit circuit. Ideally, capacitor 70 filters out only enough ripple to hold the DC voltage across the current limit circuit at a point above $V_{a\ min}$ when the current limit circuit is in its high impedance state.

While FIG. 3 illustrates the application of the present invention to the protection of a bidirectional semiconductor type switch 50, such as a Triac (trademark of The General Electric Company, Schenectady, New York), FIG. 5 illustrates the application of the present invention to another similar load circuit employing a unidirectional semiconductor-controlled rectifier or thyristor switch 90 on the DC side of the rectifier 60 as illustrated. The functioning of the lockout capacitor 70 illustrated and discussed with regard to FIGS. 3 and 4 is substantially identical in operation as illustrated and discussed with regard to FIG. 5. With the current limit circuit 10 switched to its high impedance condition, its effective resistance in combination with the lockout capacitor, and to a lesser degree with resistor 80, provides an RC time constant necessary to maintain the voltage across the current limit circuit above the predetermined voltage amplitude $V_{a\ min}$ to lock the current limit circuit at its high impedance condition regardless of clearing of a fault as long as the minimum lockout voltage is maintained across the DC output of the bridge 60.

In accordance with the present invention, lockout capacitor 70 and resistor 80, as illustrated in FIG. 5, also combine to provide a snubber network, or dv/dt suppression network, for the thyristor switch 90 to prevent its false tripping to a turn-on condition.

The dual function of the lockout capacitor 70, as illustrated in FIG. 5 as part of a snubber network and as a lockout-type device to hold the current limit circuit 10 above its recovery point voltage $V_{a\ min}$, advantageously permits short-circuit protection for line-operated semiconductor switches such as the SCR semiconductor switch 90. The illustrated circuit of FIG. 5 finds particular application on assembly line work stations wherein the load 41 is energized by a proximity circuit 100 of the solid state type, well known in the art, actuated by a metallic-type target 110. In such an application, the proximity circuit 100 (which requires DC power via a power line 111) takes the place of resistor 75 illustrated in FIG. 3 to load capacitor 70 and maintain a certain amount of desirable ripple across the current limit circuit 10 for reasons discussed earlier.

With reference to both FIGS. 3 and 5, the current limit circuit will remain at its high impedance or lockout condition until triggering of the respective switches 50 and 90 ceases, wherein reduction of current flow through the switches below their holding currents allow them to turn off, resulting in resetting of the current limit circuit 10. Such a phenomenon is well known in the art.

It is further noted that in accordance with the invention a voltage transient absorber, such as a metal oxide varistor 55, is provided across the AC input side of the bridge 60 to insulate the current limit circuit 10 and other circuit elements from high voltage transients, caused, for example, where the source or load, or interconnecting wiring, provides inductance to the circuit.

The present disclosure includes that contained in the appended claims, as well as that of the foregoing description. Although this invention has been described in its preferred form with a certain degree of particularity, it is understood that the present disclosure of the preferred form has been made only by way of example, and that numerous changes in the details of the circuit and the combination and arrangement of circuit elements may be resorted to without departing from the spirit and scope of the invention as hereinafter claimed.

What is claimed is:

1. In a circuit having in electrical series relationship an AC source, an AC load, and a load-energizing semiconductor switch, a short circuit protector comprising:

an overcurrent sensing circuit responsive to unidirectional current flowing through it, the sensing circuit being connected in electrical series relationship with the source, the load, and the semiconductor switch, the sensing circuit switching from a low impedance state to a high impedance state when the unidirectional current through it exceeds a predetermined current amplitude, the sensing circuit maintaining the high impedance state to limit current through the switch until the voltage across the sensing circuit decreases to a predetermined voltage amplitude;

a full wave rectifier means connected between the AC source and the sensing circuit for converting AC current through the load to a generally equivalent amount of unidirectional load current sensed by and routed through the sensing circuit; and capacitor means for maintaining the voltage across the sensing circuit above the predetermined voltage amplitude to hold the sensing circuit at the high impedance state subsequent to sensing an overcurrent condition.

2. A short circuit protector according to claim 1, wherein the unidirectional load current sensed by and flowing through the sensing circuit is substantially 100 percent amplitude-modulated by the rectified source voltage at twice the AC source frequency when the sensing circuit is in a low impedance state, the sensing circuit in the high impedance state combining with the capacitor means to provide an RC circuit having a time constant large enough to maintain the voltage across the sensing circuit at a level larger than the predetermined voltage amplitude, wherein the resultant unidirection load current through the sensing circuit is amplitude-modulated by the rectified source voltage to a degree less than 100 percent.

3. A short circuit protector according to claim 1, wherein the semiconductor switch means is a thyristor which when switched to a conducting condition carries the undirectional load current flowing through the sensing circuit.

4. A short circuit protector according to claim 3, wherein the capacitor means also functions as part of a snubber network electrically paralleled across the thyristor anode/cathode terminals when the sensing circuit is in the low impedance state.

5. A short circuit protector according to claim 1, wherein the semiconductor switch means is a bidirectional semiconductor switch conducting alternating current supplied to the the load.

6. In a circuit having in electrical series relationship an AC source, an AC load, and a load-energizing semiconductor switch, a short circuit protector comprising:

a two-terminal, overcurrent sensing, transistor circuit responsive to unidirectional current flowing through it and connected in electrical series relationship with the source, the load, and the semiconductor switch, the transistor circuit providing a low impedance state and a high impedance circuit protection state, the transistor circuit normally maintaining its low impedance state when the semiconductor switch is in a conducting condition, the transistor circuit switching to its high impedance state when the unidirectional current flowing through it exceeds a predetermined current amplitude indicative of a short circuit condition, the transistor circuit maintaining its high impedance state to limit current through the conducting semiconductor switch until the voltage across the sensing circuit decreases to a predetermined voltage amplitude;

a full wave rectifier between the AC source and the transistor circuit for converting AC current through the load to a generally equivalent amount of unidirectional load current sensed by and routed through the transistor circuit; and capacitor means for maintaining the voltage across the sensing circuit above the predetermined voltage amplitude to hold the transistor circuit at the high impedance state subsequent to the sensing of an overcurrent condition and only until the semiconductor switch is switched to a non-conducting condition wherein the transistor circuit resets to its low impedance state.

7. A short circuit protector according to claim 6, wherein the semiconductor switch is switched between conducting and non-conducting conditions by a proximity switch actuated by a target to actuate the AC load.

8. In a circuit having in electrical series relationship an AC source, an AC load, and a load-energizing thyristor switch, a short circuit protector comprising:

an overcurrent sensing transistor circuit having a current input and a current output, the transistor circuit being responsive to unidirectional current flowing from its input to its output, the transistor circuit providing a low impedance state and a high impedance circuit protection state, the transistor circuit normally maintaining its low impedance state when the switch is in a conducting condition, the transistor switching to its high impedance state when the unidirectional current flowing through its exceeds a predetermined current amplitude indicative of a short circuit condition, the transistor circuit maintaining its high impedance state to limit current through the conducting thyristor switch until the voltage across the sensing circuit from its input to its output decreases to a predetermined voltage amplitude;

a full wave rectifier having a two-terminal AC input side and a two-terminal DC output side, the transistor circuit and thyristor switch being connected in series with each other and across the two-terminal DC output side of the rectifier, the source and load being connected in series with each other and across the two-terminal AC input side of the rectifier, the rectifier converting AC current through the load and the source to a generally equivalent amount of unidirectional current routed through both the transistor circuit and the thyristor switch when the transistor circuit is in its low impedance state and the thyristor switch is in a conducting condition; and an RC network connected across the two-terminal DC output side of the rectifier, the RC network functioning as a snubber network to prevent false triggering of the thyristor switch when the transistor circuit is in the low impedance state, the capacitor also functioning to maintain the voltage across the transistor circuit above a predetermined voltage amplitude when the thyristor switch is in a conducting state and the transistor circuit is in the high impedance circuit protection state, wherein the transistor circuit is held at the high impedance circuit protection state until the thyristor switches to a non-conducting condition.

9. A short circuit protector according to claim 8, wherein the AC load is inductive, the circuit protector including a voltage transient suppression network connected in parallel across the AC input side of the full wave rectifier, the network functioning as a voltage transient absorber to shunt voltage spikes, induced by the inductive AC load or source, away from the transistor circuit.

* * * * *